US007907378B2

(12) United States Patent
Julicher

(10) Patent No.: US 7,907,378 B2
(45) Date of Patent: Mar. 15, 2011

(54) AUTOMATIC DETECTION OF A CMOS DEVICE IN LATCH-UP AND CYCLING OF POWER THERETO

(75) Inventor: Joseph Harry Julicher, Chandler, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 492 days.

(21) Appl. No.: 12/044,315

(22) Filed: Mar. 7, 2008

(65) Prior Publication Data

US 2008/0151456 A1 Jun. 26, 2008

Related U.S. Application Data

(63) Continuation-in-part of application No. 11/254,269, filed on Oct. 20, 2005, now abandoned.

(51) Int. Cl.
*H02H 3/08* (2006.01)
(52) U.S. Cl. ...................................................... 361/93.1
(58) Field of Classification Search ................. 361/93.1, 361/93.2
See application file for complete search history.

(56) References Cited

U.S. PATENT DOCUMENTS

| 4,823,070 A | * | 4/1989 | Nelson | 323/285 |
| 4,833,406 A | * | 5/1989 | Foster | 324/225 |
| 5,300,765 A | | 4/1994 | Mizuta | |
| 5,841,618 A | * | 11/1998 | Dilkes et al. | 361/110 |
| 6,229,350 B1 | * | 5/2001 | Ricon-Mora | 327/77 |
| RE39,065 E | * | 4/2006 | Nelson | 323/284 |
| 7,567,223 B2 | * | 7/2009 | De Oto et al. | 345/46 |
| 2006/0197720 A1 | * | 9/2006 | De Oto et al. | 345/46 |
| 2007/0091527 A1 | * | 4/2007 | Julicher | 361/93.1 |

FOREIGN PATENT DOCUMENTS

| EP | 1357461 A2 | 10/2003 |
| WO | WO 98/50856 A1 | 11/1998 |
| WO | WO 00/22500 A1 | 4/2000 |
| WO | WO 2007/047804 A2 | 4/2007 |

OTHER PUBLICATIONS

International Preliminary Report on Patentability for PCT/US2006/040808 mailed May 2, 2008.
International Search Report for PCT/US2009/035797, mailed Jun. 19, 2009.

* cited by examiner

*Primary Examiner* — Ronald W Leja
(74) *Attorney, Agent, or Firm* — King & Spalding L.L.P.

(57) ABSTRACT

A monitoring and protection circuit associated with a voltage regulator supplying power to a CMOS device can sense over current levels precisely enough for determining if a fault has occurred in a circuit of the CMOS device, e.g., latch-up, failed or shorted transistor, etc., then this monitoring and protection circuit may automatically generate a fault alert signal and/or cycle power to the CMOS device when an unexpected over current may occur, e.g., CMOS circuit latch-up. The monitoring and protection circuit may be integrated with a voltage regulator, e.g., low drop-out (LDO) voltage regulator on a single integrated circuit substrate. The monitoring and protection circuit and voltage regulator may be fabricated with a CMOS device, e.g., digital processor on a single integrated circuit substrate.

25 Claims, 3 Drawing Sheets

AUTOMATIC DETECTION OF A CMOS DEVICE IN LATCH-UP AND CYCLING OF POWER THERETO

RELATED PATENT APPLICATION

This is a continuation-in-part-application of and claims priority to commonly owned U.S. patent application Ser. No. 11/254,269; filed Oct. 20, 2005 now abandoned; entitled "Automatic Detection of a CMOS Circuit Device in Latch-Up and Reset of Power Thereto," by Joseph Harry Julicher; and is hereby incorporated by reference herein for all purposes.

TECHNICAL FIELD

The present disclosure relates to the detection of latch-up of a CMOS circuit device and reset thereof, and more particularly, to automatic detection of the CMOS circuit device in latch-up and reset of power thereto.

BACKGROUND

Complementary metal oxide semiconductor (CMOS) circuits are used extensively in digital integrated circuit devices, e.g., digital processors and the like. However, CMOS circuits are susceptible to latch-up for a variety of reasons, such as electrical fast transients (EFT), electrostatic discharge (ESD) and the like; over-voltage conditions, ionizing radiation, e.g., aerospace and military use, etc. When latch-up occurs in a CMOS circuit there may be unusually high currents drawn which may damage or destroy the CMOS circuit and also possibly the voltage regulator supplying the CMOS circuit. Latch-up of the CMOS circuit may render the circuit inoperative. A way to correct latch-up of a CMOS circuit is to cycle power to it, e.g., off then back on.

SUMMARY

There is a need for more robust CMOS devices that can withstand or be protected from the various latch-up causing events so that the occurrence of, for example but not limited to, single event upsets (SEU) and/or single event latch-up (SEL) are recoverable. If a monitoring and protection circuit associated with the voltage regulator supplying power to the CMOS device can sense over current levels precisely enough for determining if a fault has occurred, e.g., latch-up, failed or shorted transistor, etc., then this monitoring and protection circuit may automatically generate a fault alert signal and/or cycle power to the CMOS device when an unexpected over current may occur, e.g., CMOS circuit latch-up. The monitoring and protection circuit may be integrated with the voltage regulator, e.g., low drop-out (LDO) voltage regulator. The voltage regulator having the integral monitoring and protection circuit may also be integrated with a CMOS device such as a digital processor e.g., microcomputer, microcontroller, digital signal processor (DSP), application specific integrated circuit (ASIC), programmable logic array (PLA) and the like.

CMOS device operating current requirements (loads) may vary widely during normal operation thereof, and it would be useful for the CMOS device to indicate an expected current requirement (e.g., CMOS device power load) or "state information." This state information may indicate when it is appropriate to change current limits, and/or disable or enable over current monitoring. For example when the CMOS device goes into a low power or sleep mode, various logic functions stop drawings power so that the total power load of the CMOS device is reduced accordingly. However, the circuits that monitor and control the CMOS device when in a sleep mode are still susceptible to SEL and SEU events. Thus, current monitoring trip points must be adjusted accordingly.

Also, if the CMOS device draws less current than expected a latch-up condition may have occurred in a portion of the CMOS device circuits. For example, if the logic circuits of the CMOS device are not being clocked they will draw less current. Therefore if a clock circuit goes into a latch-up condition and cannot supply clock signals to the logic circuits in the CMOS device, then the CMOS device will draw less current since its logic circuits are not switching states any more. This condition may be cured by cycling power (power cycle) to the CMOS device so that the CMOS circuits that may be in latch-up are cleared, and normal operation of the CMOS device can continue.

For example, a power cycle may be initiated if the current monitoring and protection circuit detected an excessive current (e.g., CMOS circuit latch-up condition) or insufficient current (e.g., clock circuit latch-up condition) in relation to the expected operating current obtained from the state information. Thus whenever the CMOS device leaves an expected power draw window (current draw goes above or below high or low current trip values), the power to the CMOS device will cycle so as to take the CMOS device out of its latch-up condition.

The state information and/or other period signals from the CMOS device may also be used as a heartbeat for a watchdog timer function when monitoring proper operation of the CMOS device whether in a normal operating mode or a low power sleep mode. The power cycle may also be generated if the watchdog timer function failed to receive an expected response (heartbeat from the CMOS device) within a certain time (e.g., CMOS device not operating correctly—a CMOS circuit in latch-up).

The monitoring and protection circuit may also be used as a solid state circuit breaker that may have at least one current trip value. The at least one current trip value may be programmed during operation of the CMOS device for various applications requiring different operating power levels, changing the current trip value of the voltage regulator protection circuit based upon the CMOS device circuits being in a low power sleep mode or in an operating mode.

The at least one current trip value may be programmed during system fabrication and/or start-up using a customized current trip value(s) depending upon the system application (s).

In some critical applications, e.g., space, military and enterprise server applications, a CMOS device may be operating as part of a voting triad of CMOS devices. In this case, there are two other CMOS devices providing checks and back-up on the proper operation of the first CMOS device. There could possibility be a failure of the first CMOS device that may not be detected by its current monitoring and protection circuit, and/or watchdog timer. However the program application would detect failures during communications with the other two CMOS devices. Upon such an occurrence, if each CMOS device could assert a power cycle signal to the voltage regulators of the other two CMOS devices, then a power cycle vote from each of the two working CMOS devices would cause a power cycle for the failed/malfunctioning/miscommunications CMOS device.

According to a specific example embodiment of this disclosure, a system for monitoring and protection of a complementary metal oxide semiconductor (CMOS) device comprises: a complementary metal oxide semiconductor (CMOS) device; a current measurement circuit for measuring current therethrough and adapted for coupling to a power source, the current measurement circuit having a measured current output; a power switching circuit coupled to the current measurement circuit and having an output for supplying power to the CMOS device; a regulator control circuit coupled to the power switching circuit, the regulator control circuit controlling a voltage at the output of the power switching circuit; a comparator having a first input coupled to the measured current output of the current measurement circuit; a current trip set point circuit having an input coupled to the CMOS device and a first output coupled to a second input of the comparator, wherein the CMOS device sends device configuration information to the current trip set point circuit for determining a high current trip set point; and the comparator having an output coupled to the power switching circuit that causes the power switching circuit to operate normally as a voltage regulator with the regulator control circuit when the comparator output is at a first logic level, and to shut down the power switching circuit when the comparator output is at a second logic level, thereby cycling power on and off to the CMOS device, wherein the comparator output is at the first logic level when the measured current from the current measurement circuit is less than the high current trip set point, and is at the second logic level when the measured current is greater than or equal to the high current trip set point. The current trip set point circuit further comprises a second output coupled to a third input of the comparator, wherein the current trip set point circuit further determines a low current trip set point, whereby the comparator output is at the first logic level when the measured current from the current measurement circuit is greater than the low current trip set point, and is at the second logic level when the measured current is less than or equal to the low current trip set point.

According to another specific example embodiment of this disclosure, a system for monitoring and protection of a voting triad of complementary metal oxide semiconductor (CMOS) devices comprises: first, second and third complementary metal oxide semiconductor (CMOS) devices; and first, second and third voltage regulators supplying regulated power that is capable of being cycled to the respective first, second and third CMOS devices; wherein the first, second and third CMOS devices communicate with each other for determining operational health for each thereof, each of the first, second and third voltage regulators comprising: a current measurement circuit for measuring current therethrough and adapted for coupling to a power source, the current measurement circuit having a measured current output; a power switching circuit coupled to the current measurement circuit and having an output for supplying power to a respective one of the first, second and third CMOS devices; a regulator control circuit coupled to the power switching circuit, the regulator control circuit controlling a voltage at the output of the power switching circuit; a comparator having a first input coupled to the measured current output of the current measurement circuit; a current trip set point circuit having an input coupled to a respective one of the first, second and third CMOS devices and a first output coupled to a second input of the comparator, wherein the respective one of the first, second and third CMOS devices sends device configuration information to the current trip set point circuit for determining a high current trip set point; and the comparator having an output coupled to the power switching circuit that causes the power switching circuit to operate normally as a voltage regulator with the regulator control circuit when the comparator output is at a first logic level, and to shut down the power switching circuit when the comparator output is at a second logic level, thereby cycling power on and off to the respective one of the first, second and third CMOS devices, wherein the comparator output is at the first logic level when the measured current from the current measurement circuit is less than the high current trip set point, and is at the second logic level when the measured current is greater than or equal to the high current trip set point; wherein the power switching circuit of a one of the first, second and third CMOS devices shuts down when the other two of the first, second and third CMOS devices do not receive an expected communication from the one of the first, second and third CMOS devices.

BRIEF DESCRIPTION OF THE DRAWING

A more complete understanding of the present disclosure thereof may be acquired by referring to the following description taken in conjunction with the accompanying drawings wherein.

Figure 1:
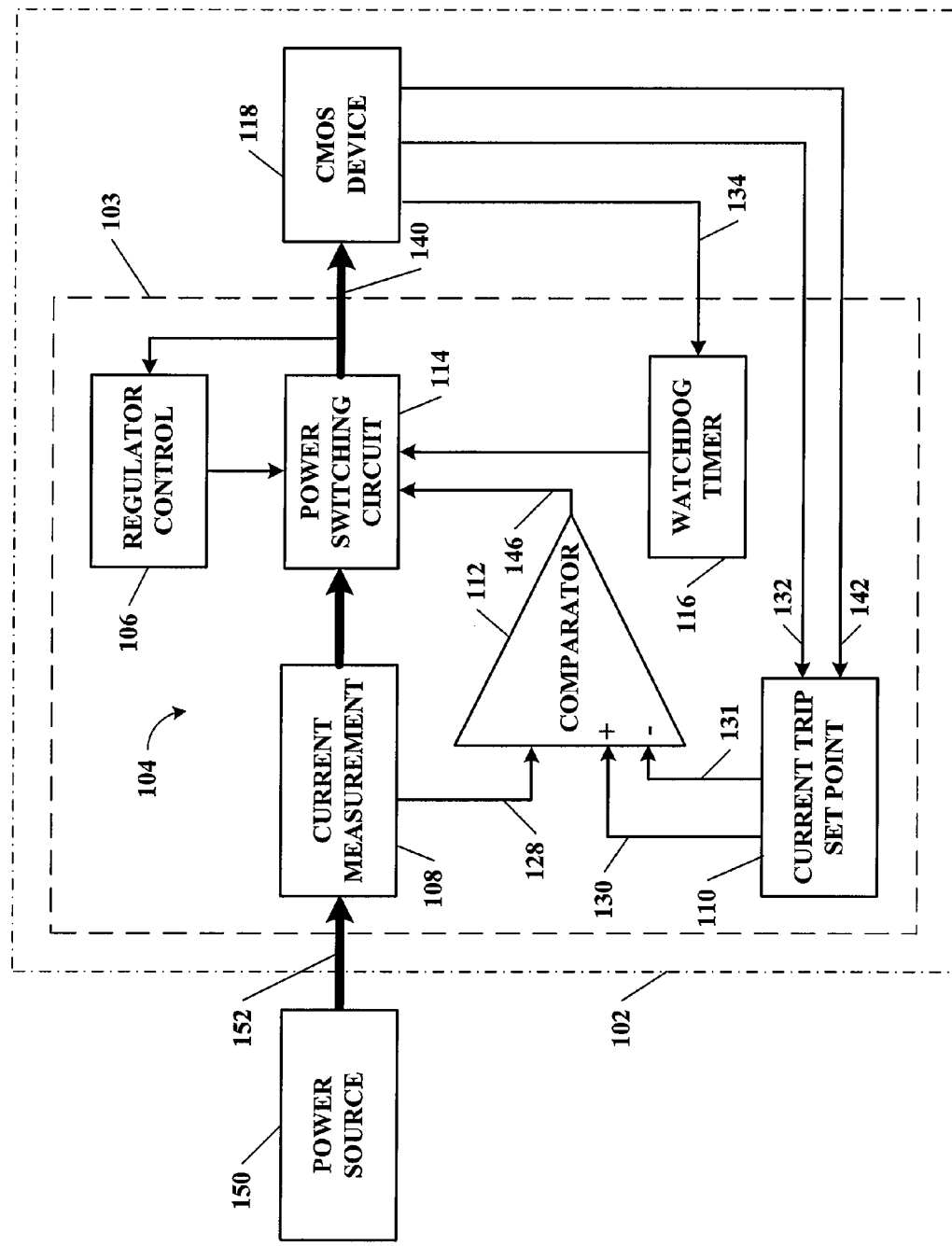
FIG. 1 illustrates a schematic block diagram of a voltage regulator capable of power cycling a CMOS device, according to a specific example embodiment of the present disclosure.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

Referring now to the drawing, the details of specific example embodiments are schematically illustrated. Like elements in the drawings will be represented by like numbers, and similar elements will be represented by like numbers with a different lower case letter suffix.

Referring to FIG. 1, depicted is a schematic block diagram of a voltage regulator capable of power cycling a CMOS device, according to a specific example embodiment of the present disclosure. The voltage regulator, generally represented by the numeral 104, may comprise a current measurement circuit 108, a current trip set point circuit 110, a comparator 112, a power switching circuit 114, a regulator control circuit 106 and a watchdog timer 116. The voltage regulator 104, e.g., low drop-out voltage (LDO) regulator, supplies a desired voltage(s) to a digital processor 118. A power source 150 supplies power (voltage and current) to the regulator 104. The regulator 104 may be fabricated on an integrated circuit substrate represented by the numeral 103. The digital processor 118, e.g., microcomputer, microcontroller, digital signal processor (DSP), application specific integrated circuit (ASIC), programmable logic array (PLA) and the like, may be fabricated on another integrated circuit substrate (not shown), or may be fabricated together with the regulator 104 on a single integrated circuit substrate represented by the numeral 102. The regulator control circuit 106 controls the power switching circuit 114 for supplying a desired voltage (s) at the output 140.

The CMOS device 118 receives power (i.e., voltage and current) from the load side 140 of the power switching circuit 114. The CMOS device 118 has an output 132 that supplies information to create a device specific trip point(s), e.g., high and/or low, and an output 142 supplies information to create an application specific trip point(s), e.g., high and/or low. The outputs 132 and 142 may be combined into a single output bus e.g., a parallel bus or a serial one-line bus. The current trip set point circuit 110 uses this information to generate a high current trip point 130 and/or a low current trip point 131 at inputs of the comparator 112.

The CMOS device 118 may also have an output 134 (e.g., CMOS circuit operating heartbeat) that may be used to reset the watchdog timer 116. The output 132 may also be included in the aforementioned single output bus to reset the watchdog timer 116 so that the output 134 may be eliminated. It is contemplated and with the scope of this disclosure that the substrate 103 of the regulator 104, and/or the substrate 102 of the regulator 104 and CMOS device 118 may be packaged in an integrated circuit package (not shown).

Whenever the measured current 128 from the current measurement circuit 108 exceeds the current trip point 130, the comparator 112 asserts a shutdown signal on a control line 146 to open the power switching circuit 114, thus removing power (voltage) from the CMOS device 118. Once power has been removed the shutdown signal on the control line 146 will be deasserted. Then after a time interval has passed the power switching circuit 114 will reconnect power to the CMOS device 118 If the CMOS device 118 CMOS circuits are in latch-up, then removing and reconnecting power may allow the CMOS circuits of the CMOS device 118 to unlatch and begin proper operation again. The amount of time appropriate for clearing a latch-up condition (removal of power with the power switching circuit 114) may be programmed into timer circuits (not shown) of the regulator 104.

If the CMOS device 118 draws less current than expected a latch-up condition may have occurred in a portion of the CMOS device circuits. For example, if the logic circuits of the CMOS device 118 are not being clocked they will draw less current. Therefore if a clock circuit goes into a latch-up condition and cannot supply clock signals to the logic circuits in the CMOS device, then the CMOS device 118 will draw less current since its logic circuits are not switching states any more. This condition may be cured by cycling power (power cycle) to the CMOS device 118 so that the CMOS circuits that may be in latch-up are cleared, and normal operation of the CMOS device 118 can continue.

Whenever the measured current 128 from the current measurement circuit 108 is below the current trip point 131, the comparator 112 asserts the shutdown signal on the control line 146 to open the power switching circuit 114, thus removing power (voltage) from the CMOS device 118. Once power has been removed the shutdown signal on the control line 146 will be deasserted. Then after a time interval has passed the power switching circuit 114 will reconnect power to the CMOS device 118 If some of the CMOS circuits, e.g., controlling clock signals, are in latch-up, then removing and reconnecting power may allow the CMOS circuits of the CMOS device 118 to unlatch and begin proper operation again. The amount of time appropriate for clearing a low current draw latch-up condition (removal of power with the power switching circuit 114) may be programmed into timer circuits (not shown) of the regulator 104.

In addition to the over and under current sensing of latch-up conditions of circuits in the CMOS device 118, the watchdog timer 116 may control the power switch 114 if not timely reset by the CMOS device 118, e.g., loss of the "heartbeat" signal therefrom. Thereby removing and reconnecting power to allow the CMOS circuits of the CMOS device 118 to unlatch and begin proper operation again. Utilizing operation of the current sensing of the comparator 112 and the timeout of the watchdog timer 116, it may be possible to detect and recover from a latch-up condition of any type in the shortest possible time.

For example, a CMOS circuit portion of the CMOS device 118 may latch-up without causing to high or to low a current draw from the regulator 104 but will cause an operational malfunction. By monitoring a "heartbeat" signal 134 from the digital processor 118, the watchdog timer may cause the power switching circuit 114 to power-cycle the CMOS device 118 and thus clear the latch-up condition.

It is contemplated and within the scope of this disclosure that the regulator 104 may also be used as a solid state circuit breaker that may have at least one current trip value, and that at least one current trip value may be programmed during operation of the CMOS device 118, or during system fabrication and/or start-up thereof.

Figure 2:
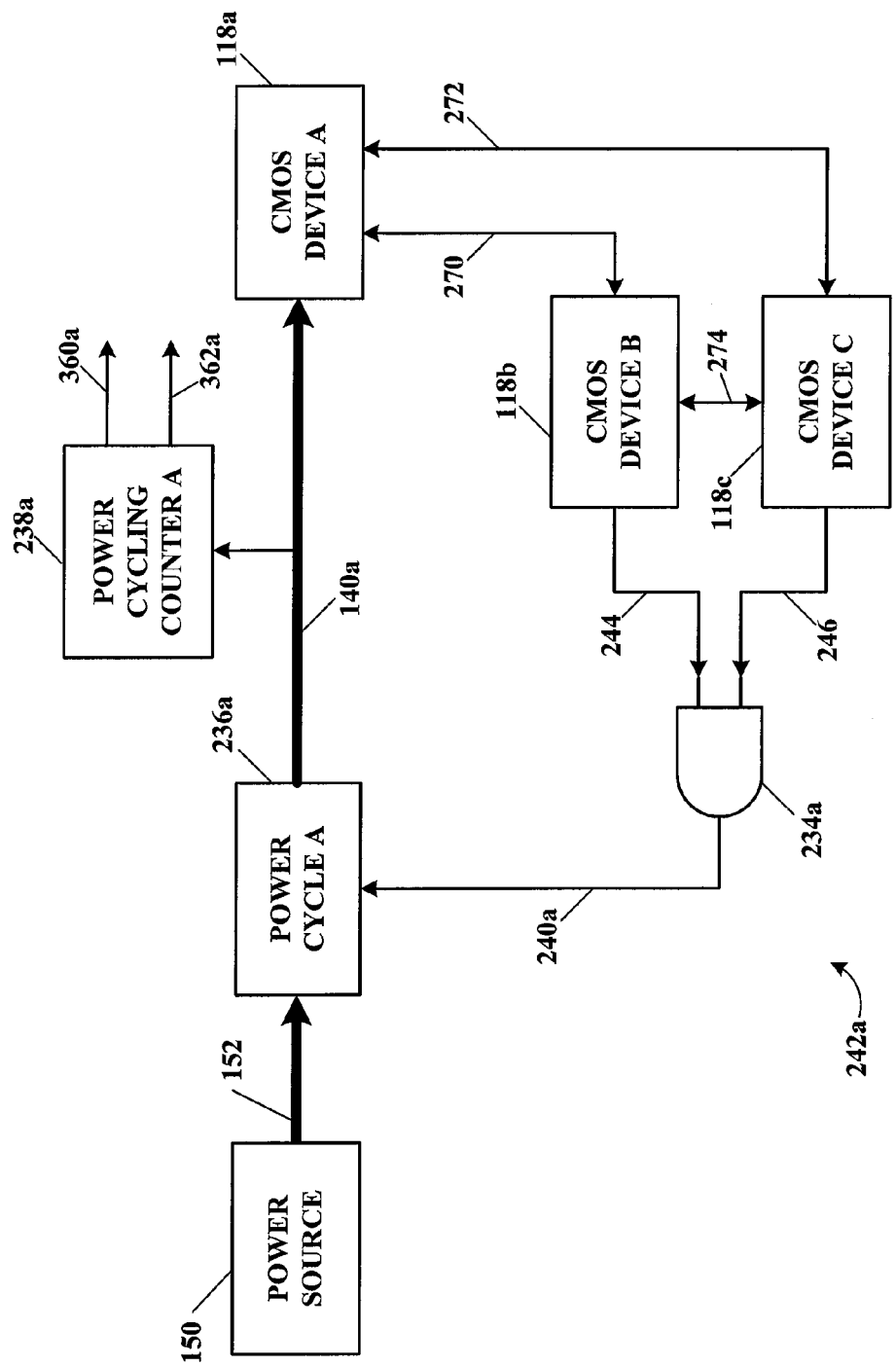
FIG. 2 illustrates a schematic block diagram of a representative one of a triad of voltage regulators capable of power cycling their respective CMOS devices that are configured as a redundant backup voting system, according to another specific example embodiment of the present disclosure.

Referring to FIG. 2, depicted is a schematic block diagram of a representative one of a triad of voltage regulators capable of power cycling their respective CMOS devices that are configured as a redundant backup voting system, according to another specific example embodiment of the present disclosure. When a plurality of CMOS devices 118, e.g., three devices, are used in a redundant backup voting system, each one of the CMOS devices 118 has a voltage regulator 104 associated with it. Power control 242 may comprise a power cycle circuit 236 and voting AND gate 234. The power control 242 may be part of each one of the voltage regulators 104 used with this redundant backup voting system. In addition, a power cycling counter 238 may be included with the power control 242 to prevent a continuous recycling condition as described more fully hereinafter.

In a redundant voting system the CMOS devices 118a, 118b and 118c communicate with one another over communications buses 270, 272 and 274. So long as communications between the CMOS devices 118a, 118b and 118c are normal, no power cycle initiation occurs. However, if for example, the CMOS device 118a fails to properly communicate with the other two CMOS devices 118b and 118c, then CMOS device 118b will initiate a power cycle signal 244 and CMOS device 118c will initiate a power cycle signal 246. The power cycle signals 244 and 246, when asserted, will cause the AND gate 242a to assert a power cycle signal 240a to the power cycle circuit 236a, thereby power cycling the non-communicative CMOS device 118a, and thus clearing a possible latch-up problem therein. If for some reason the power cycle signal 240a remains asserted, causing an undesirable number of power cycles to the CMOS device 118a, a power cycle counter 238 may assert power cycle signals 360a and 362a to the other power control circuits 242b and 242c (FIG. 3), thereby also power cycling the respective CMOS devices 118b and 118c. Now all of the CMOS devices 118a, 118b and 118c will be power cycled and thereby restored to normal operation.

Figure 3:
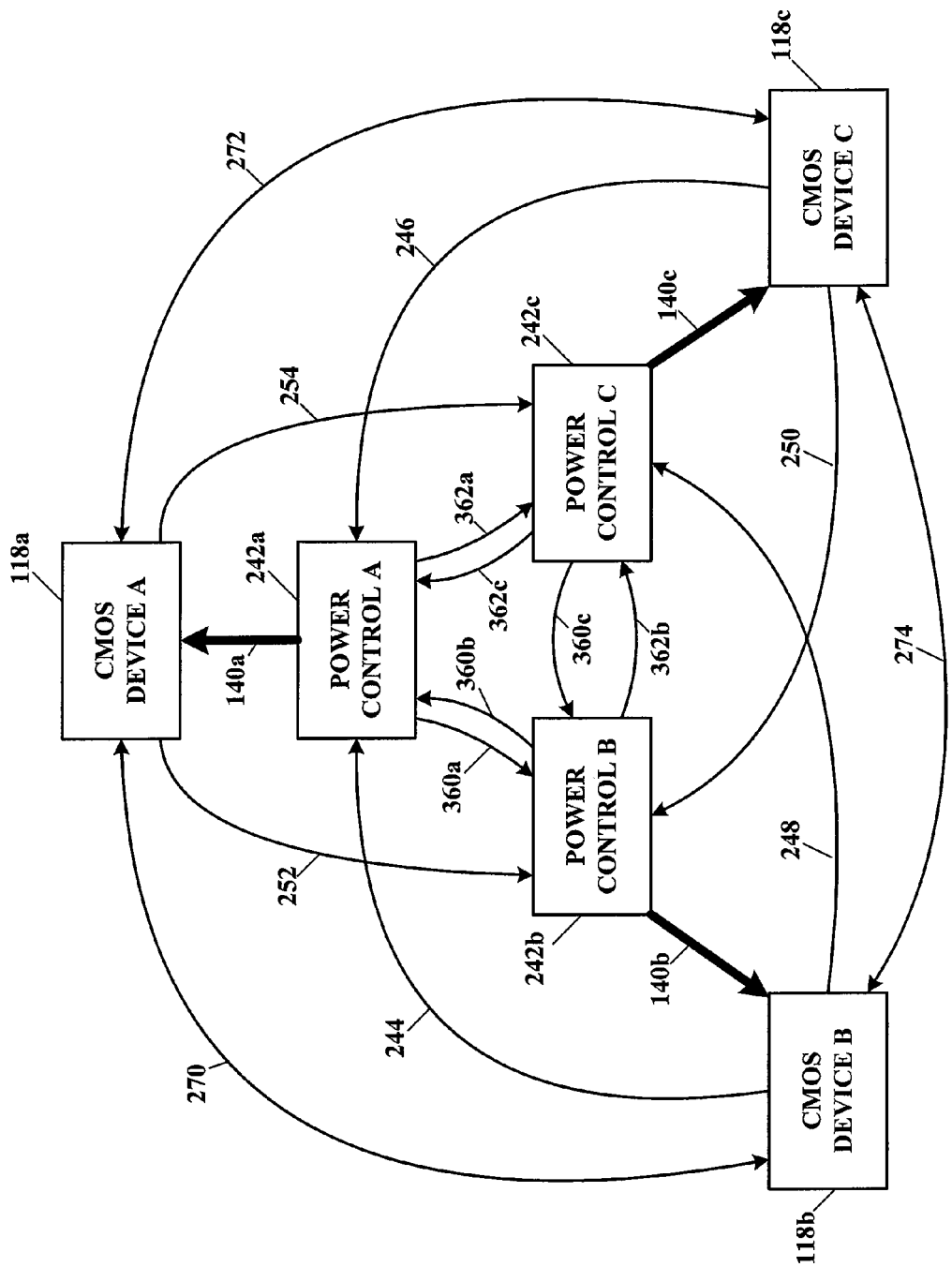
FIG. 3 illustrates a partial schematic block diagram of a triad of voltage regulators capable of power cycling their respective CMOS devices shown in FIG. 2.

Referring to FIG. 3, depicted is a partial schematic block diagram of a triad of voltage regulators capable of power cycling their respective CMOS devices shown in FIG. 2. CMOS devices 118a and 118b communicate with each other over a communications bus 270. CMOS devices 118a and 118c communicate with each other over a communications bus 272. CMOS devices 118b and 118c communicate with each other over a communications bus 274. The power cycle signal 244 is asserted from the CMOS device 118b and the power cycle signal 246 is asserted from the CMOS device 118c to the power control 242a, thus causing the power control 242a to cycle power to the CMOS device 118a. The power cycle signal 250 is asserted from the CMOS device 118c and the power cycle signal 252 is asserted from the CMOS device 118a to the power control 242b, thus causing the power control 242b to cycle power to the CMOS device 118b. The power cycle signal 248 is asserted from the CMOS device 118b and the power cycle signal 254 is asserted from the CMOS device 118a to the power control 242c, thus causing the power control 242c to cycle power to the CMOS device 118c. Power cycle signals 360 and 362 from a respective one of the power control 242 may be asserted to the other ones of the power control 242 when an excess number of power cycles may be occurring as more fully described hereinabove.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. A system for monitoring and protection of a complementary metal oxide semiconductor (CMOS) device, said system comprising:
    a complementary metal oxide semiconductor (CMOS) device;
    a current measurement circuit for measuring current therethrough and adapted for coupling to a power source, the current measurement circuit having a measured current output;
    a power switching circuit coupled to the current measurement circuit and having an output for supplying power to the CMOS device;
    a regulator control circuit coupled to the power switching circuit, the regulator control circuit controlling a voltage at the output of the power switching circuit;
    a comparator having a first input coupled to the measured current output of the current measurement circuit;
    a current trip set point circuit having an input coupled to the CMOS device and a first output coupled to a second input of the comparator, wherein the CMOS device sends device configuration information to the current trip set point circuit for determining a high current trip set point;
    the comparator having an output coupled to the power switching circuit that causes the power switching circuit to operate normally as a voltage regulator with the regulator control circuit when the comparator output is at a first logic level, and to shut down the power switching circuit when the comparator output is at a second logic level, thereby cycling power on and off to the CMOS device,
    wherein the comparator output is at the first logic level when the measured current from the current measurement circuit is less than the high current trip set point, and is at the second logic level when the measured current is greater than or equal to the high current trip set point; and
    a watchdog timer coupled to the power switching circuit and to the CMOS device, wherein the watchdog timer will shut down the power switching circuit if an expected signal from the CMOS device is not received within a certain time period, otherwise the watchdog timer allows the power switching circuit to operate normally as the voltage regulator with the regulator control circuit.

2. The system of claim 1, further comprising the current trip set point circuit having a second output coupled to a third input of the comparator, wherein the current trip set point circuit further determines a low current trip set point, whereby the comparator output is at the first logic level when the measured current from the current measurement circuit is greater than the low current trip set point, and is at the second logic level when the measured current is less than or equal to the low current trip set point.

3. The system of claim 2, further comprising the CMOS device sending application configuration information to the current trip set point circuit for determining the low current trip set point.

4. The system of claim 2, wherein the low current trip set point is programmable by the CMOS device.

5. The system of claim 2, wherein the power switching circuit and current trip set point circuit comprise an under current protection circuit.

6. The system of claim 1, further comprising the CMOS device sending application configuration information to the current trip set point circuit for determining the high current trip set point.

7. The system of claim 6, wherein the current measurement circuit, the power switching circuit, the regulator control circuit, the comparator, the current trip set point circuit and the watchdog timer are fabricated on a semiconductor integrated circuit die.

8. The system of claim 7, wherein the semiconductor integrated circuit die is enclosed in an integrated circuit package.

9. The system of claim 6, wherein the current measurement circuit, the power switching circuit, the regulator control circuit, the comparator, the current trip set point circuit, the watchdog timer and CMOS device are fabricated on a semiconductor integrated circuit die.

10. The system of claim 9, wherein the semiconductor integrated circuit die is enclosed in an integrated circuit package.

11. The system of claim 1, wherein the high current trip set point is programmable by the CMOS device.

12. The system of claim 1, wherein the power switching circuit stays off for a certain off-time before turning back on.

13. The system of claim 12, wherein the certain off-time is long enough for the CMOS device to un-latch before power is reapplied thereto.

14. The system of claim 1, wherein the current measurement circuit, the power switching circuit, the regulator control circuit, the comparator and the current trip set point circuit are fabricated on a semiconductor integrated circuit die.

15. The system of claim 14, wherein the semiconductor integrated circuit die is enclosed in an integrated circuit package.

16. The system of claim 1, wherein the current measurement circuit, the power switching circuit, the regulator control circuit, the comparator, the current trip set point circuit and the CMOS device are fabricated on a semiconductor integrated circuit die.

17. The system of claim 16, wherein the semiconductor integrated circuit die is enclosed in an integrated circuit package.

18. The system of claim 1, wherein the power switching circuit and the regulator control circuit form a low dropout (LDO) voltage regulator.

19. The system of claim 1, wherein the CMOS device is a digital processor.

20. The system of claim 19, wherein the digital processor is a microcontroller.

21. The system of claim 19, wherein the digital processor is selected from the group consisting of a microcomputer, a digital signal processor (DSP), an application specific integrated circuit (ASIC), and a programmable logic array (PLA).

22. The system of claim 1, wherein the power switching circuit and current trip set point circuit comprise an over current protection circuit.

23. A system for monitoring and protection of a voting triad of complementary metal oxide semiconductor (CMOS) devices, said system comprising:
 first, second and third complementary metal oxide semiconductor (CMOS) devices; and
 first, second and third voltage regulators supplying regulated power that is capable of being cycled to the respective first, second and third CMOS devices;
 wherein the first, second and third CMOS devices communicate with each other for determining operational health for each thereof;
 each of the first, second and third voltage regulators comprising:
  a current measurement circuit for measuring current therethrough and adapted for coupling to a power source, the current measurement circuit having a measured current output;
  a power switching circuit coupled to the current measurement circuit and having an output for supplying power to a respective one of the first, second and third CMOS devices;
  a regulator control circuit coupled to the power switching circuit, the regulator control circuit controlling a voltage at the output of the power switching circuit;
  a comparator having a first input coupled to the measured current output of the current measurement circuit;
  a current trip set point circuit having an input coupled to a respective one of the first, second and third CMOS devices and a first output coupled to a second input of the comparator, wherein the respective one of the first, second and third CMOS devices sends device configuration information to the current trip set point circuit for determining a high current trip set point; and
  the comparator having an output coupled to the power switching circuit that causes the power switching circuit to operate normally as a voltage regulator with the regulator control circuit when the comparator output is at a first logic level, and to shut down the power switching circuit when the comparator output is at a second logic level, thereby cycling power on and off to the respective one of the first, second and third CMOS devices,
  wherein the comparator output is at the first logic level when the measured current from the current measurement circuit is less than the high current trip set point, and is at the second logic level when the measured current is greater than or equal to the high current trip set point;
  wherein the power switching circuit of a one of the first, second and third CMOS devices shuts down when the other two of the first, second and third CMOS devices do not receive an expected communication from the one of the first, second and third CMOS devices.

24. A system for monitoring and protection of a complementary metal oxide semiconductor (CMOS) device, said system comprising:
 a complementary metal oxide semiconductor (CMOS) device;
 a current measurement circuit for measuring current therethrough and adapted for coupling to a power source, the current measurement circuit having a measured current output;
 a power switching circuit coupled to the current measurement circuit and having an output for supplying power to the CMOS device;
 a regulator control circuit coupled to the power switching circuit, the regulator control circuit controlling a voltage at the output of the power switching circuit;
 a comparator having a first input coupled to the measured current output of the current measurement circuit;
 a current trip set point circuit having an input coupled to the CMOS device and a first output coupled to a second input of the comparator, wherein the CMOS device sends device configuration information to the current trip set point circuit for determining a high current trip set point;
 the comparator having an output coupled to the power switching circuit that causes the power switching circuit to operate normally as a voltage regulator with the regulator control circuit when the comparator output is at a first logic level, and to shut down the power switching circuit when the comparator output is at a second logic level, thereby cycling power on and off to the CMOS device,
 wherein the comparator output is at the first logic level when the measured current from the current measurement circuit is less than the high current trip set point, and is at the second logic level when the measured current is greater than or equal to the high current trip set point; and
 a communications bus adapted for communicating with at least one other CMOS device, wherein if the at least one other CMOS device does not receive an expected signal from the CMOS device on the communications bus, then the at least one other CMOS device causes the power switching circuit to shut down, thereby cycling power on and off to the CMOS device.

25. A system for monitoring and protection of a complementary metal oxide semiconductor (CMOS) device, said system comprising:
 a complementary metal oxide semiconductor (CMOS) device;
 a current measurement circuit for measuring current therethrough and adapted for coupling to a power source, the current measurement circuit having a measured current output;
 a power switching circuit coupled to the current measurement circuit and having an output for supplying power to the CMOS device;
 a regulator control circuit coupled to the power switching circuit, the regulator control circuit controlling a voltage at the output of the power switching circuit;
 a comparator having a first input coupled to the measured current output of the current measurement circuit;
 a current trip set point circuit having an input coupled to the CMOS device and a first output coupled to a second input of the comparator, wherein the CMOS device sends device configuration information to the current trip set point circuit for determining a high current trip set point;

the comparator having an output coupled to the power switching circuit that causes the power switching circuit to operate normally as a voltage regulator with the regulator control circuit when the comparator output is at a first logic level, and to shut down the power switching circuit when the comparator output is at a second logic level, thereby cycling power on and off to the CMOS device, wherein the comparator output is at the first logic level when the measured current from the current measurement circuit is less than the high current trip set point, and is at the second logic level when the measured current is greater than or equal to the high current trip set point; and two communications buses adapted for communicating with two other CMOS devices, wherein if the two other CMOS devices do not receive expected signals from the CMOS device on the two communications buses, then the two other CMOS devices cause the power switching circuit to shut down, thereby cycling power on and off to the CMOS device.

* * * * *